(12) United States Patent
Chang et al.

(10) Patent No.: US 6,972,490 B2
(45) Date of Patent: Dec. 6, 2005

(54) BONDING STRUCTURE WITH COMPLIANT BUMPS

(75) Inventors: Shyh-Ming Chang, Hsinchu (TW);
Yuan-Chang Huang, Banciao (TW);
Wen-Chih Chen, Hsinchu (TW);
Sheng-Shu Yang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/829,115

(22) Filed: Apr. 20, 2004

(65) Prior Publication Data

US 2005/0098901 A1    May 12, 2005

(30) Foreign Application Priority Data

Nov. 6, 2003    (TW) ............................... 92131062 A

(51) Int. Cl.[7] ........................ H01L 23/48; H01L 23/52; H01L 29/40

(52) U.S. Cl. ...................... 257/737; 257/738; 257/780; 257/778; 257/787

(58) Field of Search ............................... 257/737, 738, 257/778, 780, 787

(56) References Cited

U.S. PATENT DOCUMENTS

| | | | | |
|---|---|---|---|---|
| 4,963,002 A | * | 10/1990 | Tagusa et al. | 349/149 |
| 5,393,697 A | | 2/1995 | Chang et al. | 437/183 |
| 5,431,328 A | | 7/1995 | Chang et al. | 228/180.22 |
| 5,578,527 A | | 11/1996 | Chang et al. | 437/209 |
| 5,700,715 A | * | 12/1997 | Pasch | 438/613 |
| 5,707,902 A | | 1/1998 | Chang et al. | 438/614 |
| 5,877,556 A | | 3/1999 | Jeng et al. | 257/737 |
| 6,084,301 A | | 7/2000 | Chang et al. | 257/737 |
| 6,249,051 B1 | | 6/2001 | Chang et al. | 257/737 |
| 6,365,500 B1 | | 4/2002 | Chang et al. | 438/614 |

* cited by examiner

Primary Examiner—Nitin Parekh

(57) ABSTRACT

A bonding structure with compliant bumps includes a stopper structure and a protection layer. Compliant bumps include at least a polymer bump, a metal layer and a surface conductive layer. Both the stopper structure and protection layer are formed with polymer bumps and metal layer. Compliant bumps provide bonding pad and conductive channel. Stoppers are used to prevent compliant bumps from crushing for overpressure in bonding process. The protection layer provides functions of grounding and shielding. The stoppers can be outside or connected with the compliant bumps. The protection layer has thickness smaller than the stopper structure and compliant bumps. It can be separated or connected with stoppers.

23 Claims, 12 Drawing Sheets

BONDING STRUCTURE WITH COMPLIANT BUMPS

FIELD OF THE INVENTION

The present invention relates to a bonding structure with compliant bumps for bonding semiconductor material or metal surface to substrate, and the bonding structure includes a stopper structure and a protection layer. It can be applied to bond integrated circuit (IC) or chip to substrate.

BACKGROUND OF THE INVENTION

Integrated circuits (IC) are conventionally made of semiconductors wafers. The manufacturing process of IC includes two steps. The first step is to manufacture the semiconductor wafer using semiconductor material, and the second step is using packaging technologies to package. The packaging technologies of the second step are mainly to dice the wafer into chips and then bond the chips to the substrate. The bonding pads are used to bond the chips to the substrate. The bottom layer of the bonding pads are usually made of aluminum covered with passivated metal. For low-profile chips, the bonding pads with a solder bump can bond the chips directly to the substrate. This technology has been developed in many packaging forms, including flip chip, tape-automated bonding and ball-grid array (BGA).

In general, a bonding layer is required in bonding the chips to the substrate. The bonding layer is usually made of a polymer material and the bonding is achieved using a pressurized or heating process. FIG. 1A and FIG. 1B show respectively the cross-sectional views of a conventional bonding structure before and after the bonding. A first substrate 101 has a plurality of conductive metal bonding pads 105. The area outside of bonding pads 105 is covered with a first protection layer 102 for insulation. A plurality of metal bumps 104 are grown directly on bonding pads 105 as conductive points. An anisotropic conductive film (ACF) 106 containing conductive particles 107 is placed between first substrate 101 and a second substrate 108 for bonding. The ACF is melted by using heat and pressure in order to bond first substrate 101 and second substrate 108. Bonding pads 105, metal bumps 104, conductive particles 107 and the electrode 103 on second substrate 108 form a conductive channel. The disadvantage of this technique is that it can not meet finer pitch requirement. For a finer pitch between neighboring metal bumps 104, conductive particles 107 will flow because of heat and pressure being applied. Thereby two adjacent conductive points may be short. Thus, the technique can not meet finer pitch requirement.

FIG. 2A and FIG. 2B show respectively the before and after bonding, cross-sectional views for another conventional bonding structure using non-conductive film (NCF). The difference between the NCF bonding technique and the ACF bonding technique shown in FIG. 1 is that the former directly embeds conductive particles 107 on metal bumps 104 instead of in an NCF 206. The bonding structure with NCF 206 also uses heat and pressure to melt NCF 206 in order to bond first substrate 101 and second substrate 108. The disadvantage of the NCF bonding technique is that conductive particles 107 will be lost and escape from metal bumps 104 because of the pressure and heat. The reduction of conductive particles 107 in metal bumps 104 will increase the resistance after the bonding.

The aforementioned bonding technologies both use metal bumps. Because metal bumps are hard and make it difficult for processing, therefore bumps made of flexible polymer are widely used. U.S. Pat. No. 5,578,527 and U.S. Pat. No. 5,707,902 disclosed a technique using polymer bumps. FIG. 3A and FIG. 3B show respectively the before and after bonding cross-sectional views for a bonding structure using polymer bumps. The rectangular polymer bumps 310 are covered with a conductive layer 309. This bonding technology also uses NCF 206, which is melted by pressure and heat to bond first substrate 101 and second substrate 108. Metal pads 105, conductive layer 309 and electrode 103 form a conductive channel.

FIG. 4A and FIG. 4B show respectively the before and after bonding cross-sectional view for a bonding structure using round column-shaped polymer bumps. A plurality of round column-shaped bumps 410 are placed on metal bonding pads 105. Bumps 410 are covered with a conductive layer 309. This bonding technology uses the polymer as the major material for bumps. The disadvantage of this technique is that when the bonding pressure is too large, the conductive layer covering the bumps tends to crack, which will lead to increase the resistance or even become non-conductive.

SUMMARY OF THE INVENTION

The primary object of the present invention is to provide a bonding structure with compliant bumps containing a stopper structure and a protection layer. The compliant bump includes a polymer bump, a metal layer and a conductive layer. The metal layer is located beneath the polymer bump to serve the purposes of bonding the first substrate and electrical conduction. The conductive layer covers the polymer bump surface to serve the purpose of electrical conduction to the electrode of the second substrate. The covering area ranges from 0.1% to 99% of the entire compliant bump area. The polymer bump is made of a polymer material with a low elasticity coefficient. Compared to the metal bumps, the polymer bumps can reduce the required pressure for bonding, although the cracking still occurs sometimes.

Accordingly, the stopper structure of the present invention can prevent the cracking of the compliant bump. Each stopper includes a polymer bump and a metal layer. The metal layer is located beneath the polymer bump to serve the purpose of bonding the first substrate. The height of the stopper can be adjusted by the pressure applied during the bonding process and the deformation extent of the compliant bump can be controlled precisely. The location of the stopper can be either in the external or internal area of the compliant bump. The area of distribution of the stopper can range from 0.1% to 99% of the entire first substrate area.

The second protection layer of the present invention is to serve the purposes of protecting the first substrate and grounding. The protection layer, manufactured using a photo-lithography process, is located outside the metal bonding pads. The second protection layer includes a polymer layer and a metal layer, and can be connected to the stopper or independently distributed. The thickness of the second protection layer is smaller than the respective thicknesses of the stopper and the compliant bump. The area of distribution of the stopper can range from 0.1% to 99% of the entire first substrate area. In other words, the stopper can substantially or partially cover the entire first substrate.

The compliant bump and the stopper are both manufactured using a photo-lithography process. There can be many choices for the shapes and dimensions of the compliant bump and the stopper and theft distribution of the first substrate surface. The choice depends on the pressure of the facility, the polymer material, the type of the first substrate and the second substrate. The thickness of the stopper is larger than that of the second protection layer, and is different from the thickness of the compliant bump. The surfaces of the compliant bump and the stopper may contain convexes and concaves, instead of being smooth. The bonding structure and the first substrate together form a component. The bonding film used to bond this component and the second substrate can be ACF, NCF or non-conductive glue. And the methods to bond the bonding film are thermal consolidation, thermal compressing consolidation, UV consolidation, or ultrasonic consolidation, or a combination of any of the above methods.

The compliant bump, the stopper and convex and the concave on their surfaces can have the following shapes: rectangle, square, trapezoid, sphere, round-column, cone, or irregular, or a combination of any of the above shapes.

The stopper structure of the present invention is to prevent the compliant bump from cracking during the bonding process, retain the conductive particles and improve the yield rate of the bonding. The present invention replaces the conventional metal with a more elastic polymer material in order to bond with a more fragile substrate, such as glass. This reduces the manufacturing cost. Furthermore, the second protection layer can protect the first substrate from damaging and can provide the ground connection.

The present invention can be applied in bonding IC, silicon chips, dices, glass substrates, polymer substrates, non-organic substrates, organic substrates, and silicon substrates.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1A:
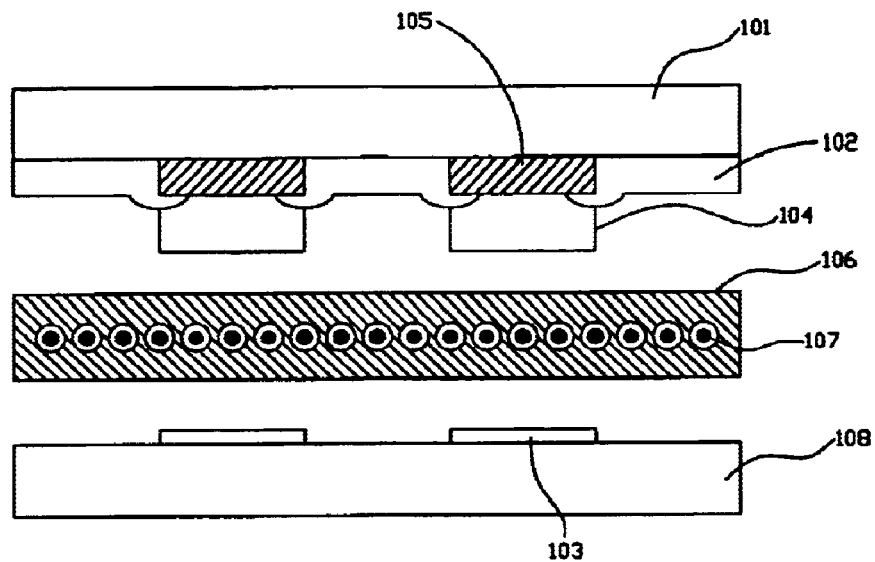
FIGS. 1A and 1B show respectively a cross-sectional view of a conventional bonding structure using ACF before and after bonding.
Figure 1B:
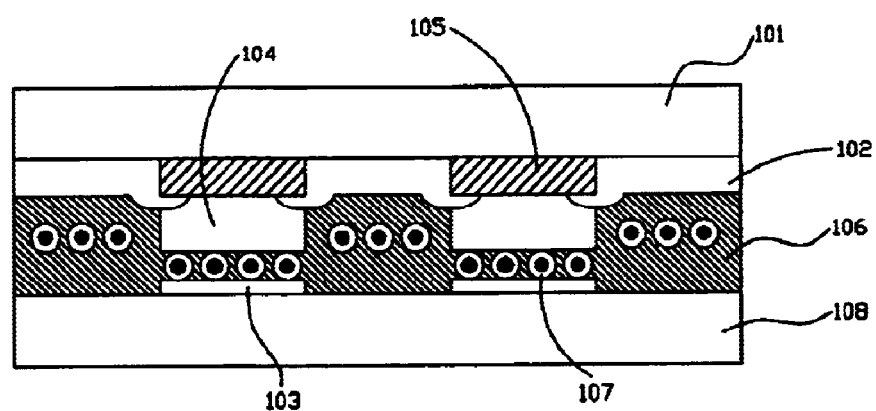
Figure 2A:
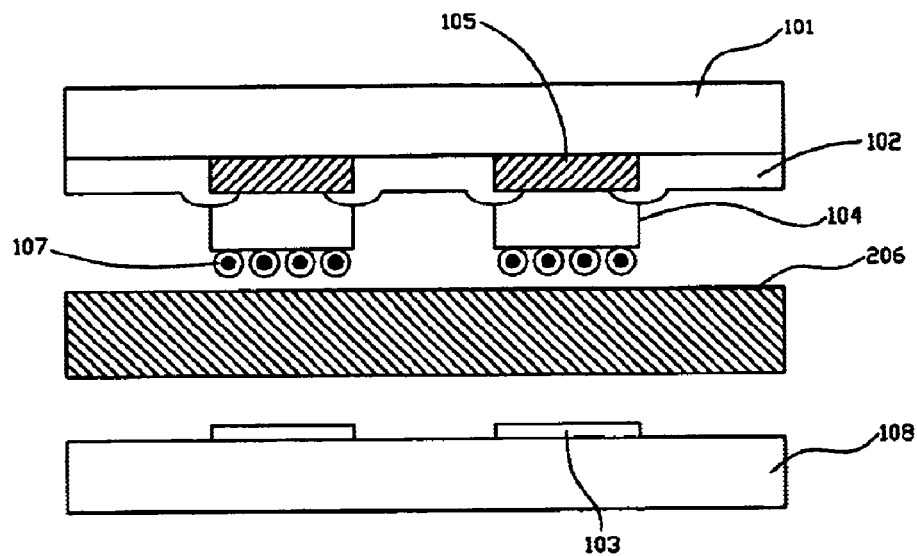
FIGS. 2A and 2B show respectively a cross-sectional view of a conventional bonding structure using NCF before and after bonding.
Figure 2B:
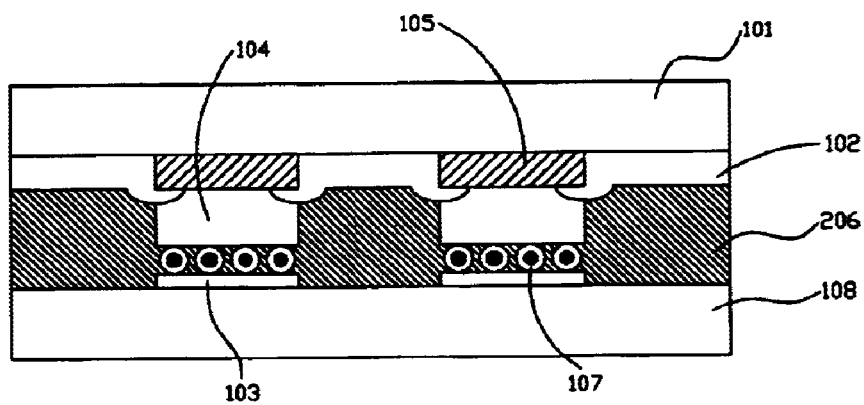
Figure 3A:
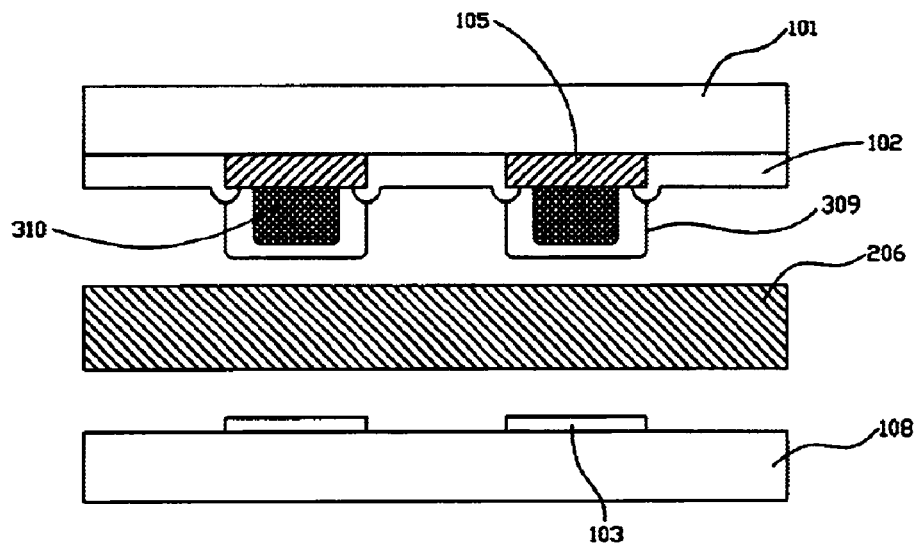
FIGS. 3A and 3B show respectively a cross-sectional view of a conventional bonding structure using polymer bumps before and after bonding.
Figure 3B:
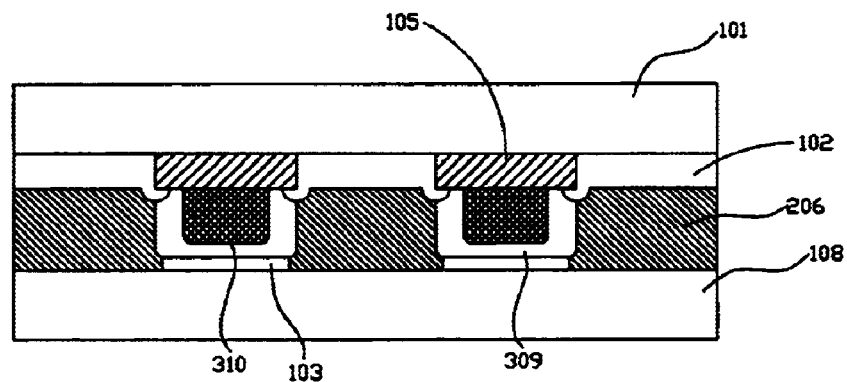
Figure 4A:
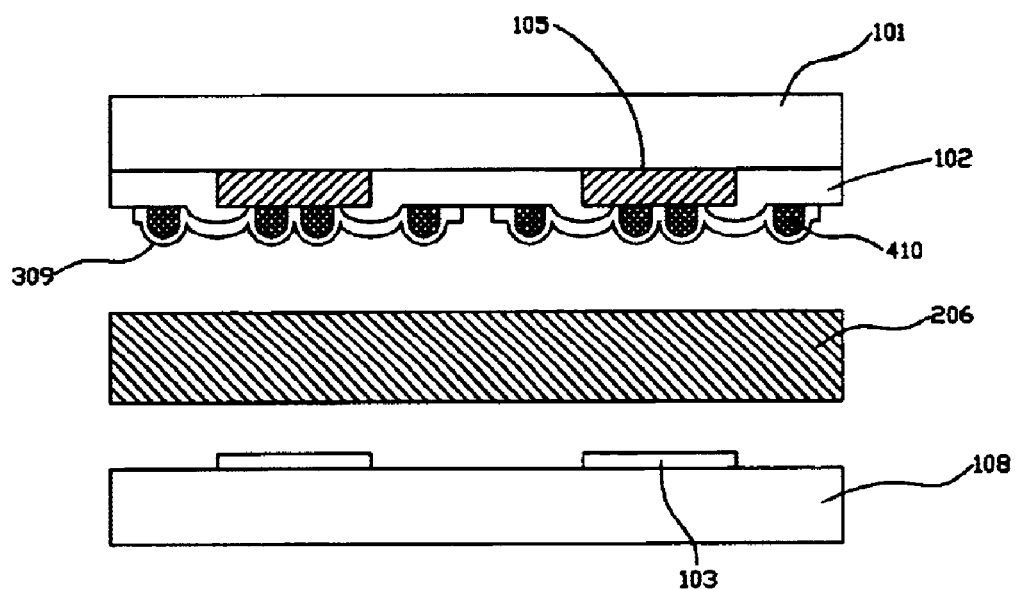
FIGS. 4A and 4B show respectively a cross-sectional view of a conventional bonding structure using round column-shaped polymer bumps before and after bonding.
Figure 4B:
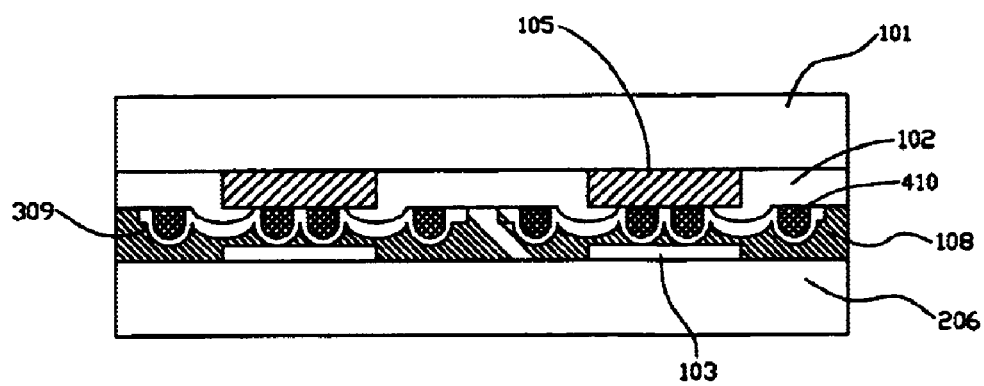
Figure 5A:
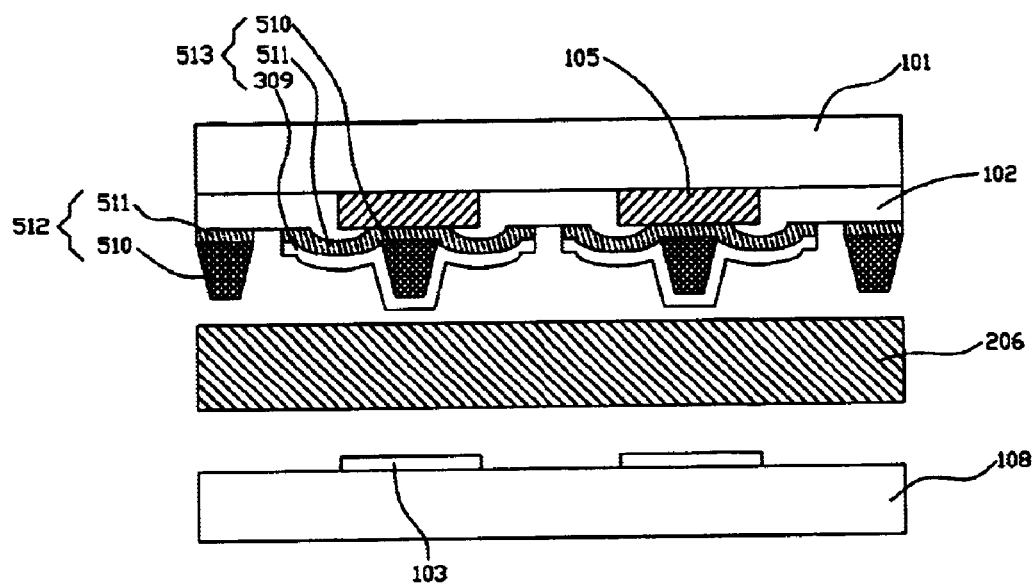
FIGS. 5A and 5B show respectively a cross-sectional view of the bonding structure using compliant bumps with a stopper structure before and after bonding.
Figure 5B:
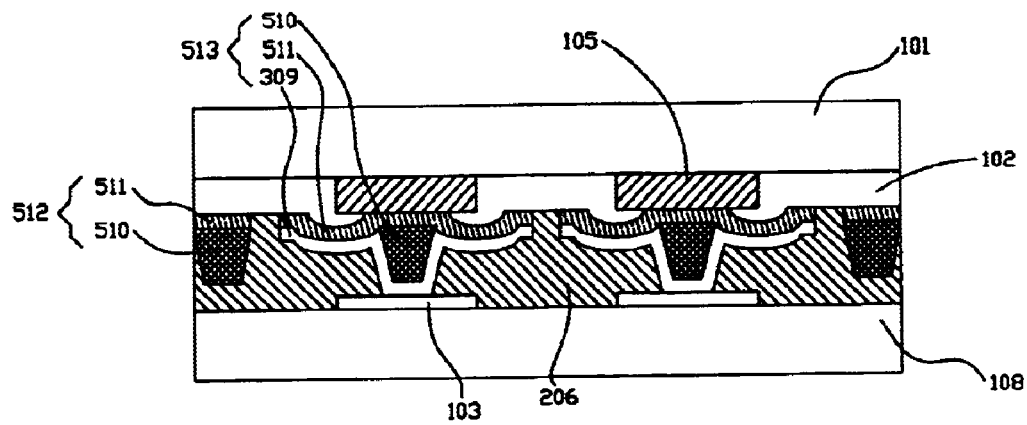

FIG. 5A shows a preferred embodiment of the bonding structure with compliant bumps containing stoppers. In this embodiment, a first substrate 101 has a plurality of metal bonding pads 105 and is covered with a first protection layer 102. Metal bonding pads 105 serve as the conductive channel to first substrate 101. A metal layer 511 located on first protection layer 102 is connected to polymer bumps and first protection layer 102 or bonding pads 105. Conic bumps 510 are made of polyimide and form a stopper 512 together with metal layer 511. Polyimide is a polymer material with high mechanical strength and high chemical resistance. Each compliant bump 513, located on bonding pads 105 for electrical conduction, includes metal layer 511, conic bump 510, and conductive layer 309. Conductive layer 309 covers the entire topmost layer of compliant bumps 513. In this embodiment, the bonding structure includes two compliant bumps 513 at the center and two stoppers 512 on both sides. NCF 206 is located between first substrate 101 and second substrate 108, and can be melted by heat or UV with pressure in order to bond first substrate 101 and second substrate 108, as shown in FIG. 5B. Metal bonding pads 105, metal layer 511 conductive layer 309 and electrode 103 form a conductive channel.

Figure 6A:
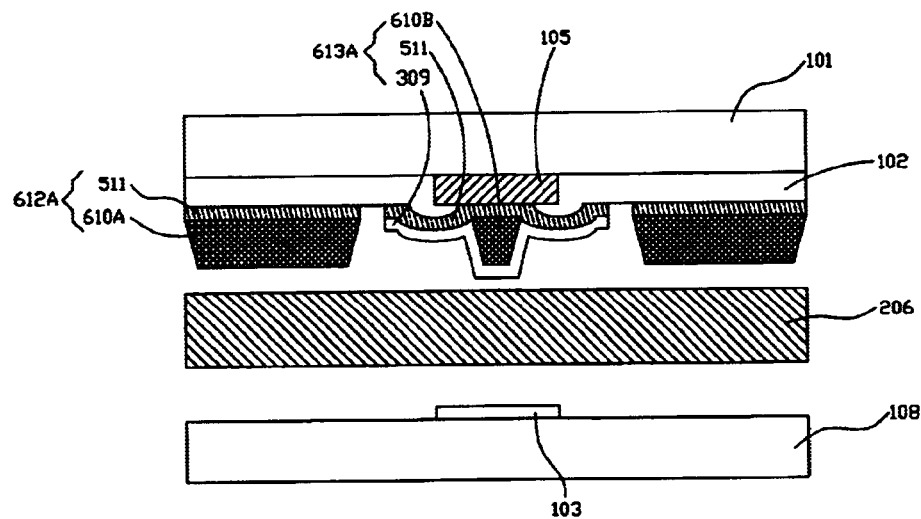
FIGS. 6A–6D show respectively a cross-sectional view of different shapes of the compliant structure and the stopper.
Figure 6B:
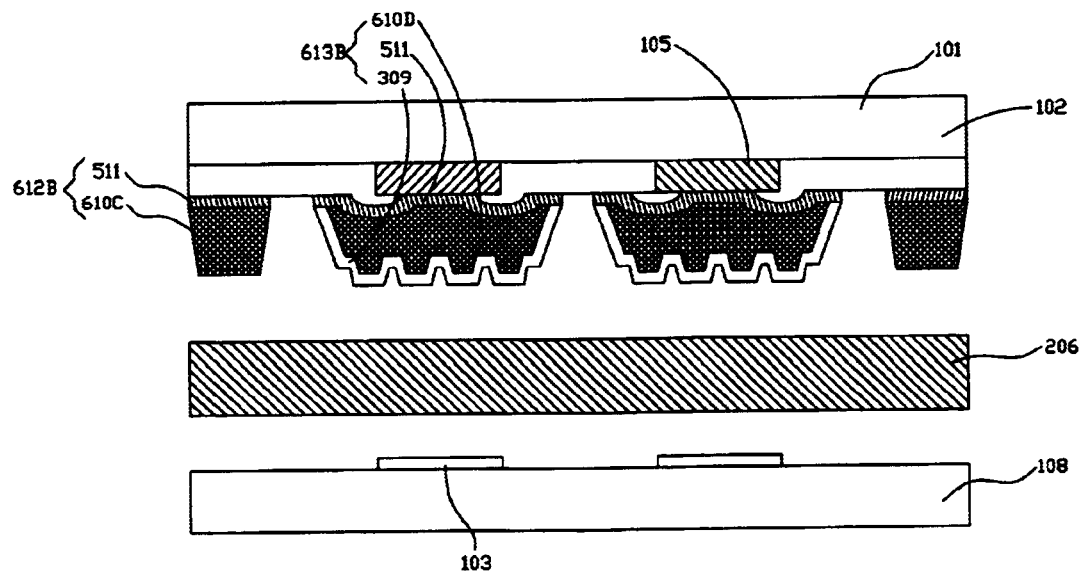

Both the stoppers and the compliant bumps are conic in FIG. 5A. In accordance with the present invention, the stoppers and the compliant bumps can have different shapes. As shown in FIG. 6A, the two stoppers 612A on both sides of the first substrate are made of metal layer 511 and trapezoid bumps 610A. The compliant bump 613A on the inner side of the first substrate is made of metal layer 511, conic bump 610B and conductive layer 309. The monolithic bumps should have stronger mechanical strength. The size of the bonding area depends on the size of the bump top area. The more pressure the bonding needs, the more difficult to perform the bonding. Therefore, to achieve the sufficient mechanical strength and ease of bonding, the Convex-concave surface structure of the compliant bumps can be adopted, as shown in FIG. 6B. Stopper 612B is made of metal layer 511 and trapezoid bump 610C. Compliant bump 613B is made of metal layer 511, the convex-concave-surfaced trapezoid bump 610D and conductive layer 309. Compared to the smooth-surfaced bump, the convex-concave-surfaced bump has a smaller contact surface with electrode 103 of second substrate 108. Therefore, only a smaller pressure is required to perform the bonding. For two bumps with the identical volume and identical mechanical strength, the one with a convex-concave surface requires a smaller pressure to bond than the one with a smooth surface.

Figure 6C:
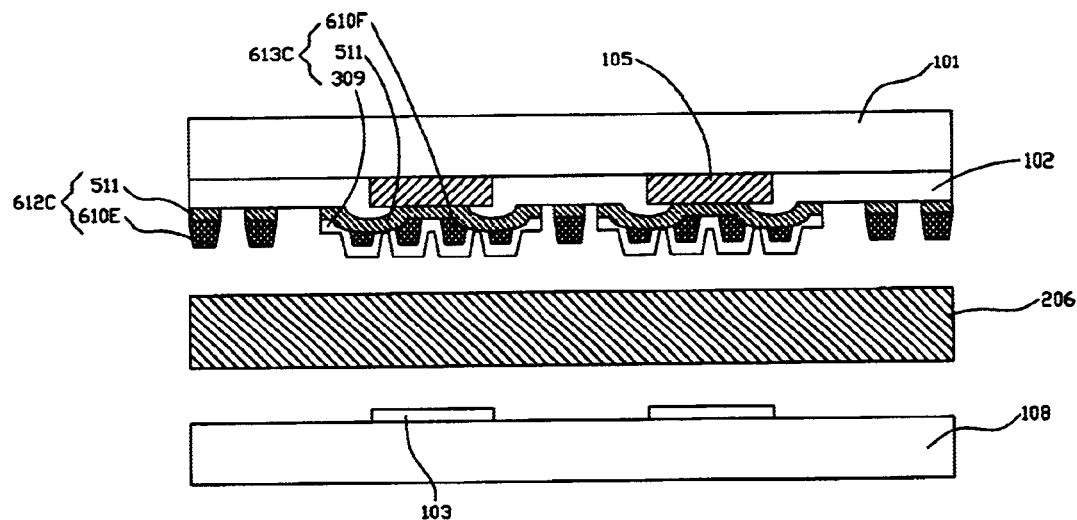
Figure 6D:
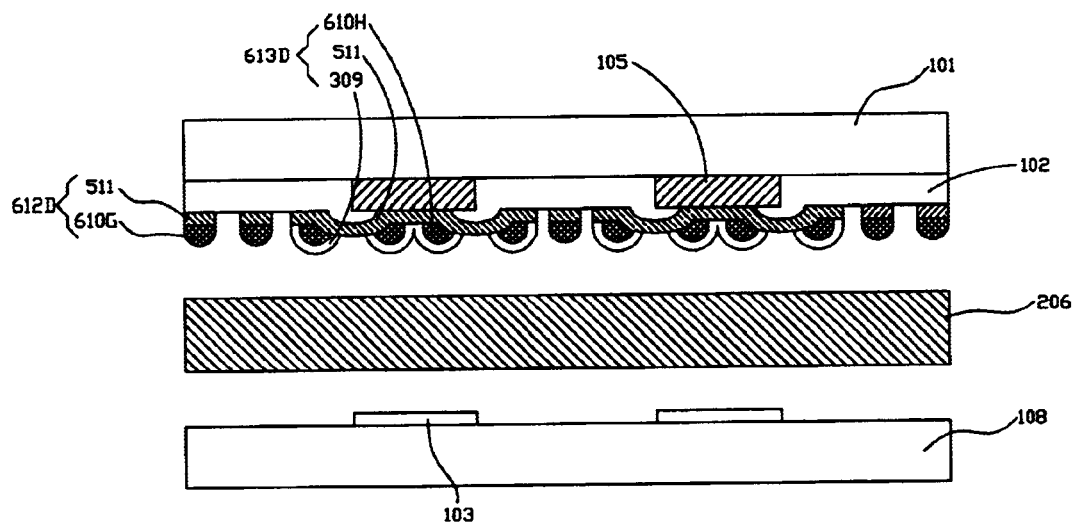

FIG. 6C shows a cross-sectional view of another convex-concave-surfaced compliant bumps. The compliant bumps and the stoppers of this structure have a smaller volume but are more densely distributed. The top of metal bonding pads 105 is distributed with a plurality of trapezoidal bumps 610F. Stopper 612C is made of metal layer 511 and a plurality of trapezoidal bumps 610E. Compliant bump 613C is made of metal layer 511 and a plurality of trapezoidal bumps 610F and conductive layer 309. FIG. 6D shows a similar structure to the structure in FIG. 6C, but the bumps in FIG. 6D has the shape of a round column. The top of a round column is a hemisphere. Stopper 612D is made of metal layer 511, a plurality of round column bumps 610G. Compliant bump 613D is made of metal layer 511, a plurality of round column bumps 610H and conductive layer 309.

Figure 7A:
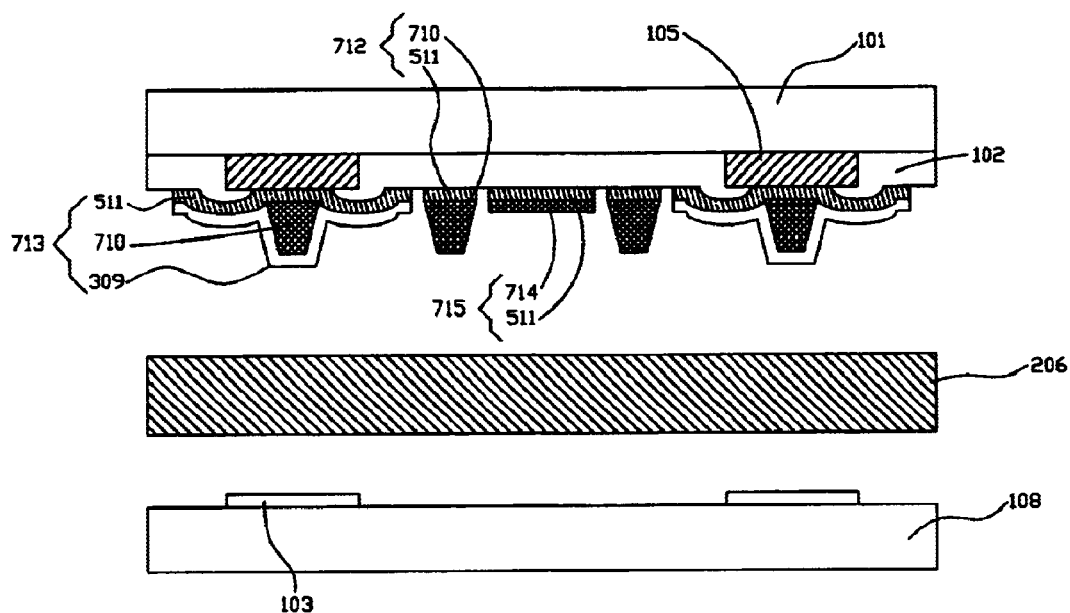
FIGS. 7A and 7B respectively show a cross-sectional view of two designs of the second protection layer.
Figure 7B:
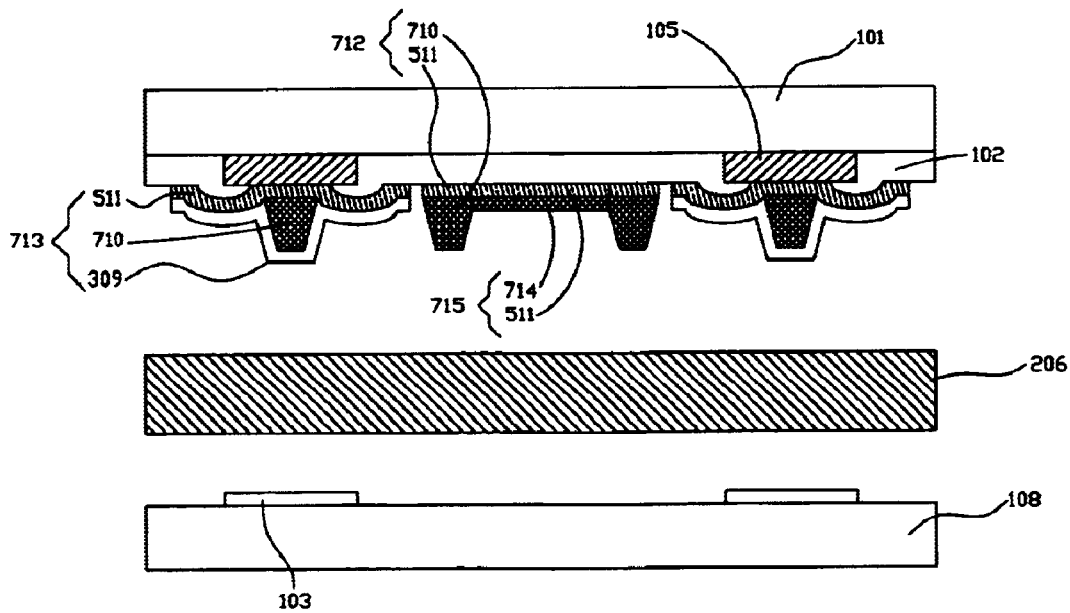

FIG. 7A shows a second protection layer 715 and stopper 712 of the present invention. Second protection layer 715 is manufactured using a photo-lithography process during the manufacturing of stopper 712 and compliant bump 713. Second protection layer 715 is made of metal layer 511 and polymer layer 714. Polymer layer 714, on top of metal layer 511, uses the same material as trapezoid bumps 710. Stoppers 712, made of trapezoid bump 710 and metal layer 511, are on both sides of second protection layer 715. Compliant bumps 713 are on the two ends of first substrate 101. Second protection layer 715 is to protect first substrate 101 from damaging during the bonding of first substrate 101 and second substrate 108 and also to provide grounding. FIG. 7B shows second protection layer 715 and stopper 712 are connected together. The thickness of second protection layer 715 must be smaller than the respective thicknesses of stopper 712 and compliant bump 713.

Figure 8:
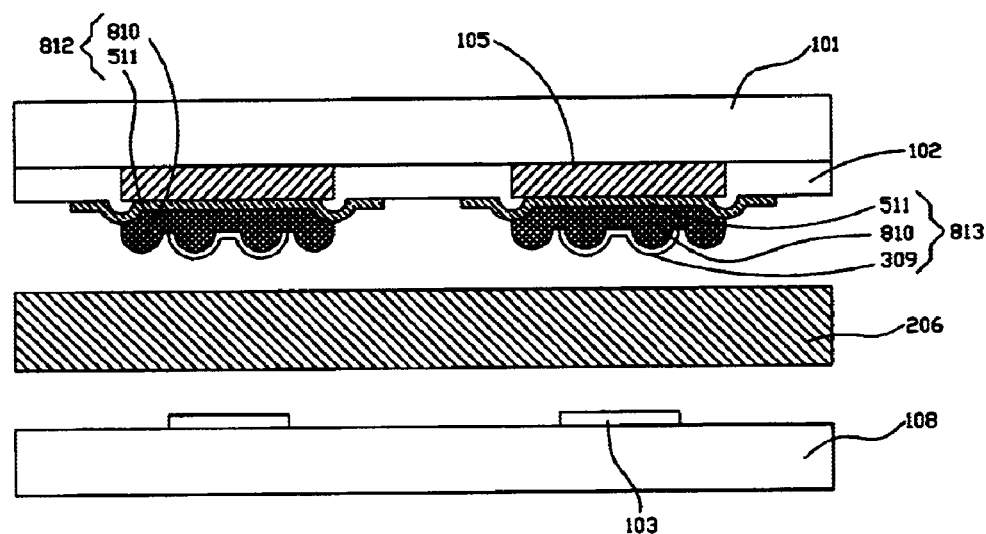
FIG. 8 shows a cross-sectional view of the stopper inside the compliant bump.

In addition, the stopper can be connected to the compliant bump. FIG. 8 shows a cross-sectional view of a stopper inside a compliant bump. A bump 810 with a surface containing a plurality of hemispheres has a bottom metal layer 511 to connect bonding pads 105. The entire compliant bump 813 is made of metal layer 511, bump 810 and conductive layer 309. Stopper 812, made of bump 810 and metal layer 511, is located on both sides of compliant bump 813. The center of the bump is covered with conductive layer 309, which, together with metal layer 511 and bonding pads 105, forms a conductive channel.

Figure 9A:
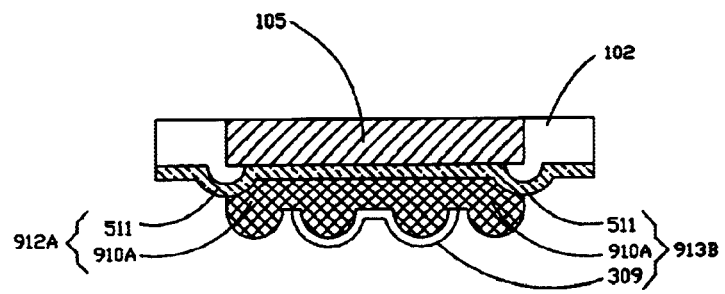
FIGS. 9A–9C show a cross-sectional view of the compliant bumps having different convex and concave surface designs.
Figure 9B:
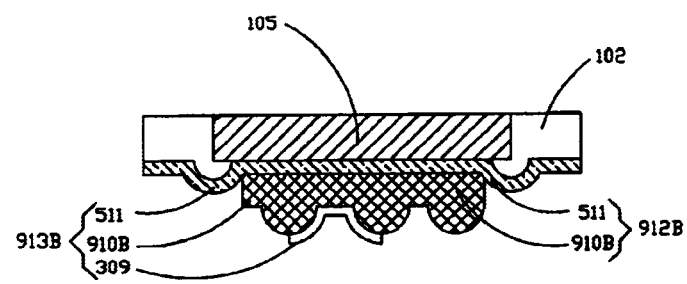
Figure 9C:
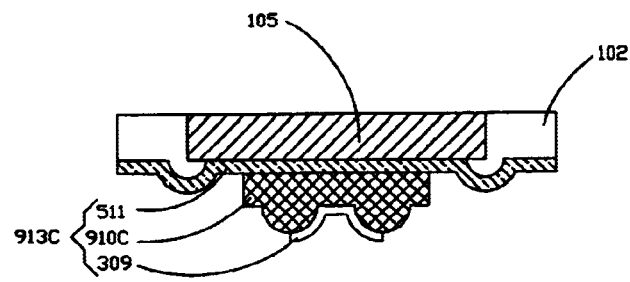

FIG. 9A shows a compliant bump with an internal stopper. Stopper 912A, made of bump 910A and metal layer 511, is located on both sides of compliant bump 913A. Conductive layer 309, covering the center of compliant bump 913A, also covers the entire hemisphere structure. FIG. 9B shows another compliant bump with an internal stopper, where only one end has a stopper. Internal stopper 912B is made of metal layer 511 and hemispheric-surfaced bump 910B. Compliant bump 913B is made of metal layer 511, bump 910B and conductive layer 309. Conductive layer 309 only covers half of the area of the hemisphere surface. Conductive layers 309 covering two neighboring hemispheres are also connected. FIG. 9C shows a compliant bump without an internal stopper. Compliant bump 913C is made of metal layer 511, bump 910C and conductive layer 309. The surface of bump 910C includes a plurality of hemispheres half covered with conductive layer 309.

The compliant bumps containing the hemisphere or convex-concave surfaces can be used with both ACF and NCF bonding technologies. When ACF is used, the contact area between the compliant bump and the electrode of the second substrate is smaller so that the compliant bump requires a smaller pressure to achieve the deformation extent for bonding. Also, the conductive particles are trapped inside the convex-concave surface to avoid the flow caused by the heat and pressure. As aforementioned, the two ends of the convex-concave surface can both have stoppers or bumps not covered with conductive layer. Therefore, the two neighboring bonding pads will not become short due to the conductive particles. The reduction of the pitch between the electrodes can also improve the insulation. The present invention can also be used in substrates having fine pitch between bonding pads. If heat is applied in melting the films, the flowing adhesive material can be expelled out of the component through the gaps and controlled direction in the convex-concave surface structure.

Figure 10:
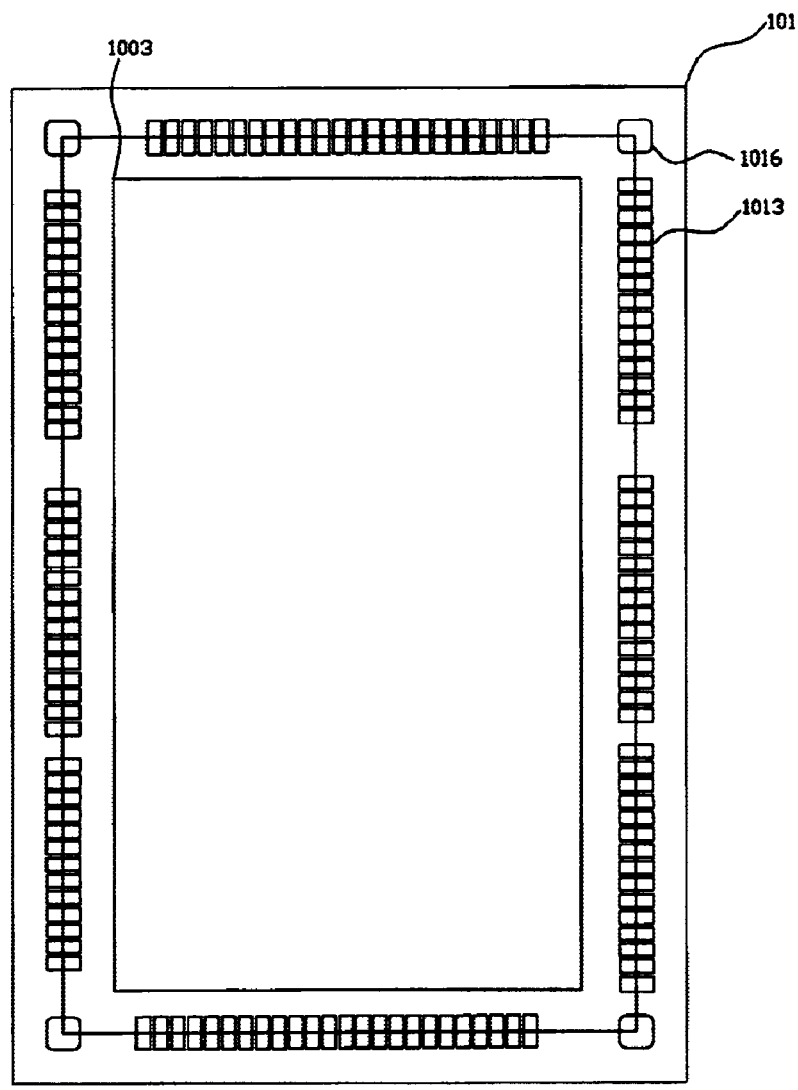
FIG. 10 shows a top view of the entire component including the compliant bump.

FIG. 10 shows a top view of the component. First substrate 101 is surrounded with a plurality of rectangular compliant bumps 1013 and four square stoppers 1016 at the four corners. The area 1003, distributed with the stoppers and the compliant bumps, is located at the center. The distribution of stoppers can have the shape of a spot, bar, continuous bar, delimited bar, arc, fan, or any arbitrary shape. The distribution area of the stopper or the second protection layer can range from 0.1% to 99% of the entire area of the first substrate.

Figure 11A:
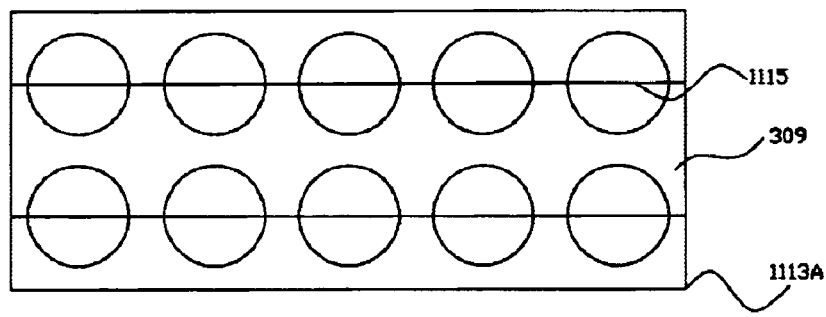
FIGS. 11A–11D show a top view of the compliant bumps having different convex and concave surface designs and stopper arrangement.

FIG. 11A shows a top view of a first embodiment of a rectangular compliant bump 1013. Rectangular compliant bump 1113A has two parallel rows of spheres 1115, and the stoppers are distributed outside of the compliant bump. Conductive layer 309 only covers half of each sphere 1115, and the outer half of spheres 1115 is not covered.

Figure 11B:
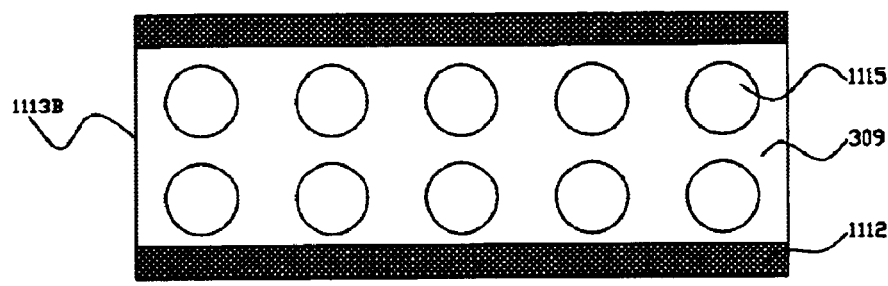

FIG. 11B shows a top view of a second embodiment of a rectangular compliant bump 1013. Rectangular compliant bump 1113B has two parallel rows of spheres 1115, and the stripe stoppers 1112 are distributed on both ends, inside the compliant bump 1113B. Conductive layer 309 covers the entire spheres 1115, but not the stoppers 1112.

Figure 11C:
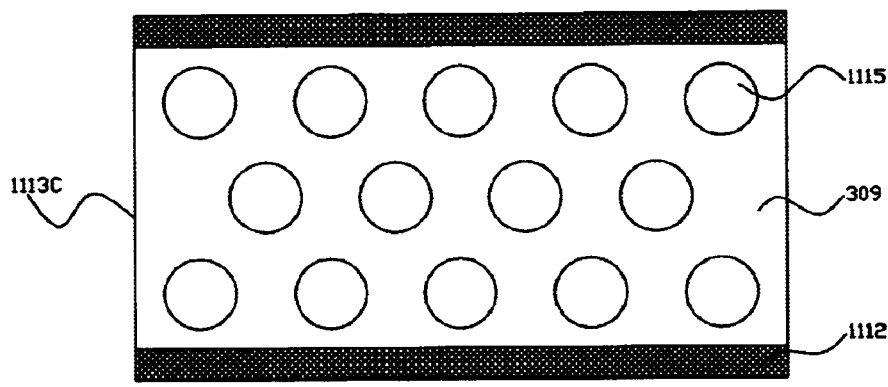

FIG. 11C shows a top view of a third embodiment of a rectangular compliant bump 1013. Rectangular compliant bump 1113C has three skewed parallel rows of spheres 1115, and the stripe stoppers 1112 are distributed on both ends, inside the compliant bump 1113C. Conductive layer 309 covers the entire spheres 1115, but not the stoppers 1112. The stripe stoppers 1112 must be arranged in the direction orthogonal to the neighboring side of the first substrate to facilitate the expelling of flowing adhesive material.

Figure 11D:
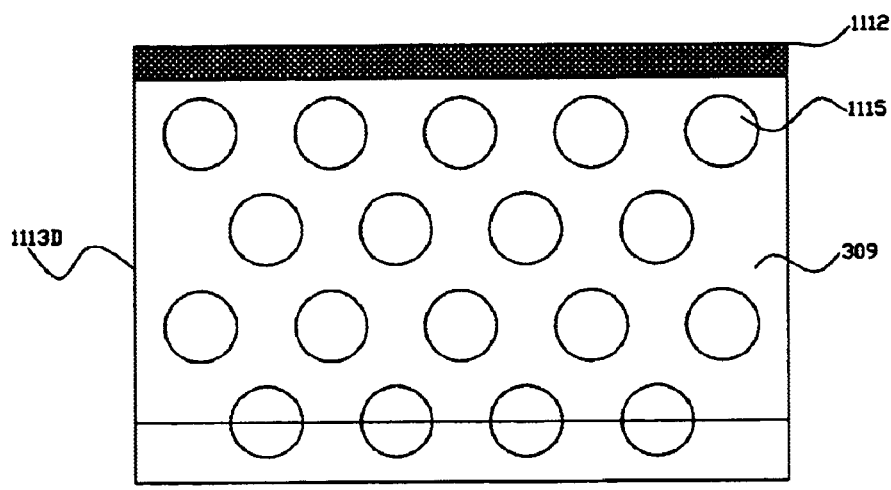

FIG. 11D shows a top view of a fourth embodiment of a rectangular compliant bump 1013. Rectangular compliant bump 1113D has four skewed parallel rows of spheres 1115, and the stripe stopper 1112 is distributed on one end, inside the compliant bump 1113D. The spheres 1115 at the other end without the stripe stopper 1112 are only half covered with conductive layer 309. Conductive layer 309 does not cover the stopper 1112.

The aforementioned embodiments show that the present invention can be extended to many varieties of compliant bump designs. When applied in combination with appropriate stoppers and protection layers, the present invention can be used in bonding to many types of second substrates. For different manufacturing facilities, the present invention can be adjusted to improve the yield rate and reduce the cost.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A bonding structure with compliant bumps, comprising:
   a device comprising:
   a first substrate acting as a carrier;
   at least a metal bonding pad on said first substrate, said metal bonding pad providing electrical conduction to said first substrate;
   a first protection layer on a surface of said first substrate, said first protection layer covering an outside of said metal bonding pad and providing insulation and protection;
   at least a compliant bump providing a conductive channel for said device; and
   at least a stopper for preventing said compliant bump from cracking during bonding;

a second substrate having at least a conductive electrode; and a film between said device and said second substrate for bonding said device to said second substrate;

wherein said compliant bump further comprises:

a metal layer on top of said metal bonding pad and said first protection layer;

at least a polymer bump on said metal layer; and a conductive layer covering said polymer bump and forming a conductive channel with said metal bonding pad and said metal layer.

2. The bonding structure as claimed in claim 1, wherein said conductive layer covers said polymer bump substantially or partially.

3. The bonding structure as claimed in claim 1, wherein said stopper is distributed outside or connected with said compliant bump.

4. The bonding structure as claimed in claim 1, wherein said compliant bump has a convex-concave surface.

5. The bonding structure as claimed in claim 1, wherein said second substrate is an organic substrate or a non-organic substrate.

6. The bonding structure as claimed in claim 1, wherein said stopper has a thickness different from said compliant bump.

7. The bonding structure as claimed in claim 1, wherein said film is a conductive or non-conductive film.

8. A bonding structure with compliant bumps, comprising:

a device comprising:

a first substrate acting as a carrier;

at least a metal bonding pad on said first substrate, said metal bonding pad providing electrical conduction to said first substrate;

a first protection layer on a surface of said first substrate, said first protection layer covering an outside of said metal bonding pad and providing insulation and protection;

at least a compliant bump providing a conductive channel for said device; and at least a stopper for preventing said compliant bump from cracking during bonding;

a second substrate having at least a conductive electrode; and a film between said device and said second substrate for bonding said device to said second substrate;

wherein said stopper further comprises:

a metal layer on top of said first protection layer; and at least a polymer bump on said metal layer.

9. The bonding structure as claimed in claim 8, wherein said second substrate is an organic substrate or a non-organic substrate.

10. The bonding structure as claimed in claim 8, wherein said stopper has a thickness different from said compliant bump.

11. The bonding structure as claimed in claim 8, wherein said stopper is distributed outside or connected with said compliant bump.

12. The bonding structure as claimed in claim 8, wherein said compliant bump has a convex-concave surface.

13. The bonding structure as claimed in claim 8, wherein said film is a conductive or non-conductive film.

14. A bonding structure with compliant bumps, comprising:

a device comprising:

a first substrate acting as a carrier;

at least a metal bonding pad on said first substrate, said metal bonding pad providing electrical conduction to said first substrate;

a first protection layer on a surface of said first substrate, said first protection layer covering an outside of said metal bonding pad and providing insulation and protection;

at least a compliant bump providing a conductive channel for said device; and at least a stopper for preventing said compliant bump from cracking during bonding;

a second substrate having at least a conductive electrode; and a film between said device and said second substrate for bonding said device to said second substrate;

wherein said device further comprises a second protection layer formed by a metal layer and a polymer layer to provide grounding and protect said first substrate.

15. The bonding structure as claimed in claim 14, wherein said polymer layer is on top of said metal layer and made of a same material of said compliant bump.

16. The bonding structure as claimed in claim 14, wherein said stopper is distributed outside or connected with said compliant bump.

17. The bonding structure as claimed in claim 14, wherein said second protection layer has a thickness smaller than the respective thicknesses of said compliant bump and said stopper.

18. The bonding structure as claimed in claim 14, wherein said second protection layer is connected to said stopper.

19. The bonding structure as claimed in claim 14, wherein said second protection layer is separate from said stopper.

20. The bonding structure as claimed in claim 14, wherein said film is a conductive or non-conductive film.

21. The bonding structure as claimed in claim 14, wherein said compliant bump has a convex-concave surface.

22. The bonding structure as claimed in clam 14, wherein said second substrate is an organic substrate or a non-organic substrate.

23. The bonding structure as claimed in claim 14, wherein said stopper has a thickness larger than said second protection layer and has a different thickness from said compliant bump.

* * * * *